(12) United States Patent
Ide

(10) Patent No.: US 10,432,158 B1
(45) Date of Patent: Oct. 1, 2019

(54) APPARATUSES AND METHODS FOR A CHOPPER INSTRUMENTATION AMPLIFIER

(71) Applicant: Micron Technology, Inc., Boise, ID (US)

(72) Inventor: Akira Ide, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/052,586

(22) Filed: Aug. 1, 2018

(51) Int. Cl.
*H03F 3/45* (2006.01)

(52) U.S. Cl.
CPC ... *H03F 3/45475* (2013.01); *H03F 2200/165* (2013.01); *H03F 2200/168* (2013.01); *H03F 2200/171* (2013.01); *H03F 2200/261* (2013.01); *H03F 2200/375* (2013.01); *H03F 2203/45116* (2013.01)

(58) Field of Classification Search
CPC ........................................................ H03F 3/45
USPC ..................................................... 330/9, 252
See application file for complete search history.

(56) References Cited

U.S. PATENT DOCUMENTS

| | | | |
|---|---|---|---|
| 6,734,723 B2 * | 5/2004 | Huijsing | ............. H03F 3/45982 330/9 |
| 6,753,727 B2 * | 6/2004 | Magoon | ............... H03F 3/45977 330/150 |
| 8,031,001 B2 | 10/2011 | Ide | |
| 2007/0237264 A1 * | 10/2007 | Huang | ................... H03D 3/008 375/332 |

OTHER PUBLICATIONS

U.S. Appl. No. 16/121,377 titled "Apparatuses and Methods for High Sensitivity TSV Resistance Measurement Circuit" filed Sep. 4, 2018.
U.S. Appl. No. 16/138,435, titled "Apparatuses for Selective TSV Block Testing", filed Sep. 21, 2018.

* cited by examiner

*Primary Examiner* — Henry Choe
(74) *Attorney, Agent, or Firm* — Dorsey & Whitney LLP

(57) ABSTRACT

Embodiments of the disclosure are drawn to apparatuses and methods for a chopper instrumentation amplifier. For a variety of applications, such as testing the resistance of connections between layers of a memory, it may be desirable to provide a high gain instrumentation amplifier. A chopper instrumentation amplifier may provide a high gain while allowing a wide range of common input voltages and a canceling an offset on the amplifier. An example chopper instrumentation amplifier of the present disclosure may include a plurality of amplifiers including chopper amplifiers and non-chopper amplifiers. The chopper amplifiers may use chopper circuits to cancel out an offset voltage of the amplifiers. Low pass filters may be used to minimize the impact of the chopper amplifiers.

16 Claims, 10 Drawing Sheets

APPARATUSES AND METHODS FOR A CHOPPER INSTRUMENTATION AMPLIFIER

BACKGROUND

Differential amplifiers are circuits used to amplify a difference between two input voltages of the amplifier. An example of a differential amplifier is an operational amplifier ("op-amp") which receives a non-inverting input (V+) and an inverting input (V−) and outputs a single-ended output (Vout). Feedback between the output and the inverting input may be used to control a gain of the circuit.

An instrumentation amplifier may be a circuit which uses a main amplifier to amplify a differential signal and one or more additional amplifiers as input buffers. Instrumentation amplifiers may be used to test electronic equipment. In one example application, instrumentation amplifiers may be used to measure a resistance of connections (e.g., through silicon/substrate vias, TSVs) between semiconductor dies or chips of a semiconductor memory device.

FIG. 1 is a schematic diagram of a prior art instrumentation amplifier. The instrumentation amplifier 100 includes a first amplifier 102 coupled to a second amplifier 104. The first amplifier 102 includes two operational amplifiers OP1 and OP2. The outputs of OP1 and OP2 are coupled by resistors R21, R1, and R22 which are coupled in series from the output of OP1 to the output of OP2. The inverting input of OP1 is coupled between resistors R21 and R1, and the inverting input of OP2 is coupled between R1 and R22. The non-inverting input of OP1 is coupled to an input voltage INp, while the non-inverting input of OP2 is coupled to an input voltage INn. The outputs of OP1 serves as in input IA1$p$ to the second amplifier 104, and the output of OP2 serves as an input IA1$n$ to the second amplifier 104. The operational amplifiers OP1 and OP2 may act as input buffers on the inputs INp and INn respectively.

The second amplifier 104 includes an op-amp OP3. The input IA1$p$ is coupled to ground via resistors R31 and variable resistor R41 coupled in series. The non-inverting input of OP3 is coupled between R31 and R41. The input IA1$n$ is coupled to the output of OP3 via resistors R32 and R42, which are coupled in series. The inverting input of OP3 is coupled between R32 and R42. The resistors R21 and R22 are equal in resistance to each other. The resistors R31 and R32 are equal in resistance, and the variable resistor R41 has a default resistance equal the resistance R42.

The first amplifier 102 receives the voltages INp and INn as inputs, and provides voltages IA1$p$ and IA1$n$ as outputs. The input voltages may be expressed as a common voltage Vcom (a voltage equal across the differential inputs) and a differential signal amplitude Vin. Thus, the input voltage INp may be expressed as Vcom+(½)*Vin, while the voltage at Inn may be expressed as Vcom−(½)*Vin. From this, the output voltages V(1A1$p$) and V(1A1$n$) may be calculated by equations 1 and 2 below:

$$V(IA1p) = Vcom + Vin\left(\frac{1}{2} + \frac{R2}{R1}\right) + VOS1\left(1 + \frac{R2}{R1}\right) - VOS2\left(\frac{R2}{R1}\right) \quad \text{Eqn. 1}$$

$$V(IA1n) = Vcom - Vin\left(\frac{1}{2} + \frac{R2}{R1}\right) - VOS1\left(\frac{R2}{R1}\right) + VOS2\left(1 + \frac{R2}{R1}\right) \quad \text{Eqn. 2}$$

R2 is the value of the resistors R21 and R22, which have an equal resistance to each other. VOS1 and VOS2 are offset voltages which may exist on the input voltages INp and INn of the non-inverting inputs of the op-amps OP1 and OP2, respectively. The voltages VOS1 and VOS2, as shown in FIG. 1, may have a reversed polarity to each other. The difference Vdif between the two outputs V(1A1$p$) and V(1A1$n$) may be derived by subtracting Eqn. 2 from Eqn. 1 to yield equation 3 below:

$$Vdif = \left(1 + 2\frac{R2}{R1}\right)(Vin + VOS1 - VOS2) \quad \text{Eqn. 3}$$

From the above equations, the amplification factor (gain) Acom1 of the common voltage Vcom and the amplification factor A1 of the differential signal Vin may be determined by equations 4 and 5 below:

$$Acom1 = 1 \quad \text{Eqn. 4}$$

$$A1 = 1 + 2\frac{R2}{R1} \quad \text{Eqn. 5}$$

Accordingly, since the common gain Acom1 is unity, the common voltage between the differential inputs INp and INn will not be increased, while the differential voltage Vin will increase by a factor based on the value of R2 and R1. The second amplifier 104 receives the amplified outputs provided by the first amplifier 102 as an input. The common input voltage between inputs IA1$p$ and IA1$n$ remains Vcom, since the Acom1 of the first amplifier 102 is 1. If the difference between the offset voltages VOS1 and VOS2 is assumed to be negligible (e.g., VOS1=VOS2), then the voltage of IA1$p$ is Vcom+(½)*Vdif, while the voltage of IA1$n$ is Vcom−(½)*Vdif. Thus, the voltage Vout provided by the second amplifier 104 may be estimated by equation 6 below:

$$VOUT \approx Vdif\left(\frac{R4}{R3}\right) + VOS3\left(1 + \frac{R4}{R3}\right) + Vcom\left(\frac{R4}{R3 + R4}\Delta\right) \quad \text{Eqn. 6}$$

In equation 6, the values of resistors R31 and R32 are assumed to be equal to R3. The value of resistor R42 is equal to R4. The adjustable resistor R41 has an initial value R4 which is trimmed to cancel offset. The above equation assumes that the resistor R41 is trimmed by a percentage of its value Δ, and that Δ is much less than 1. VOS3 is the offset voltage of the third op-amp OP3. By dividing the above equations, a common amplification Acom2 and a differential amplification A2 of the second amplifier 104 can be determined to be:

$$Acom2 = \frac{R4}{R3 + R4}\Delta \quad \text{Eqn. 7}$$

$$A2 = \frac{R4}{R3} \quad \text{Eqn. 8}$$

From the above equations, the overall output of the instrumentation amplifier 100 may be determined by equation 9 below:

$$VOUT \approx Vin \cdot A1 \cdot A2 + (VOS1 + VOS2)A1 \cdot A2 + VOS3(1 + A2) + Vcom \cdot Acom2 \quad \text{Eqn. 9}$$

The output depends on an amplification of the signal (e.g., Vin*A1*A2) as well as offset error terms dependent on VOS1, VOS2, and VOS3. The second and third terms of equation 9 (e.g., the offset error terms) may offset by adjusting the trimming percentage Δ to cancel the offset error in the output. However, in order to adjust the trimming percentage, the input common mode voltage Vcom must be set to a known predetermined value.

FIG. 2 shows a prior art adjustable resistor 200. The adjustable resistor 200 may, in some embodiments, be used as the adjustable resistor R41 of FIG. 1. The adjustable resistor 200 may include input node IN, output node OUT, a number of resistors R1-R10 (here labeled with their resistance values, e.g., 200 k, 300 k etc.), and switches SW0-SW7. Although specific values are shown for the resistors, it is to be understood that the adjustable resistor 200 may be configured with many different values of resistor R1-R10. Similarly, the adjustable resistor 200 may have more or less switches than the eight switches SW0-SW7 shown.

The switches SW0-SW7 may be sequentially activated by a counter (not shown) to decrease the resistance of the adjustable resistor 200. In the example adjustable resistor 200 shown, the adjustable resistor 200 has a default resistance of 500 k due to the values of R1 and R2 (e.g., 200 k and 300 k) in series between the input and output nodes (IN and OUT respectively). As the switches SW0 to SW7 are activated in sequence, the value of the adjustable resistor 200 may decrease in eight stages from −3% to −24%. Although the example adjustable resistor 200 shows only a decrease in resistance from a default value, additional resistors and switches may be added in series between the input node IN and output node OUT to allow for an increase in the resistance of adjustable resistor 200.

The adjustable resistor 200 may be optimized for a specific application. For example, when used to trim an instrumentation amplifier (e.g., amplifier 100 of FIG. 1), the step width (e.g., the number of steps between the maximum and minimum resistance) as well as the values of the maximum and minimum resistance may be optimized. The adjustable resistor 200 may be operated by a counter, which may be responsive to an output of the amplifier 100 in order to automatically determine the amount of trim needed to cancel the offset error of the amplifier 100.

FIG. 3 shows a diagram indicative of operating characteristics for an instrumentation amplifier. FIG. 3 includes graph 300, which illustrates the operating characteristics of an instrumentation amplifier such as the instrumentation amplifier 100 of FIG. 1 for two different gain configurations of the instrumentation amplifier. The x-axis of the graph 300 is the output voltage of the amplifier Vout. The y-axis of the graph 300 is the common voltage between the differential inputs Vcom. The graph 300 illustrates an example scenario wherein the amplifier 100 of FIG. 1 is configured to provide a high gain, in this case a gain of 100. The dotted lines show a scenario where an overall gain of 100 is achieved by setting the gains (e.g., by selecting resistor values) of the first amplifier 102 and the second amplifier 104 to 10. The solid lines show a scenario where the overall gain of 100 is achieved by setting a gain of the first amplifier 102 to 100 and the gain of the second amplifier 104 to 1.

Instrumentation amplifiers (e.g., amplifier 100) may be used to test a variety of circuit components. If a known current is used, the instrumentation amplifier may measure a voltage in order to determine a resistance of a circuit component, in order, for example, to check for manufacturing defects and/or damage to the component. The amplifier may need to have a sensitivity to small changes in resistance. While increasing a gain of the amplifier may increase small changes in the signal, it may also prevent easy cancellation of the offset and narrow a range of common voltages in which the instrumentation amplifier can stably operate. There remains a need for high-gain instrumentation amplifiers which can correctly cancel offset and stably operate while keeping the range of the input common mode voltage wide.

DETAILED DESCRIPTION

The following description of certain embodiments is merely exemplary in nature and is in no way intended to limit the invention or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

An example application for an instrumentation amplifier will be described in order to illustrate the advantages of an instrumentation amplifier of the present disclosure. While a particular application will be described, it is to be understood that the present disclosure may be used for many applications in various fields, and that minor changes may be made to optimize the amplifier for other applications without departing from the present disclosure.

In particular, the example application for an instrumentation amplifier of the present disclosure is testing connections between layers of a semiconductor memory device.

The different layers may be coupled by through silicon/substrate vias (TSVs) which may be conductive elements which run vertically between layers (e.g., stacked dies) of a semiconductor memory device (e.g., dynamic random access memory DRAM). The TSVs may be tested to determine if they have sufficient conductivity (e.g., low resistance) and passed if they have a resistance below a threshold value. A predetermined current Im may flow through one or more TSVs which may generate a voltage drop Vm across the TSV in response to the resistance along the TSV. Because the current Im and potential resistance of the TSV may both be small, the voltage Vm may also be small. Thus, the voltage may need to be amplified to in order for reliable measurement/detection.

Figure 1:
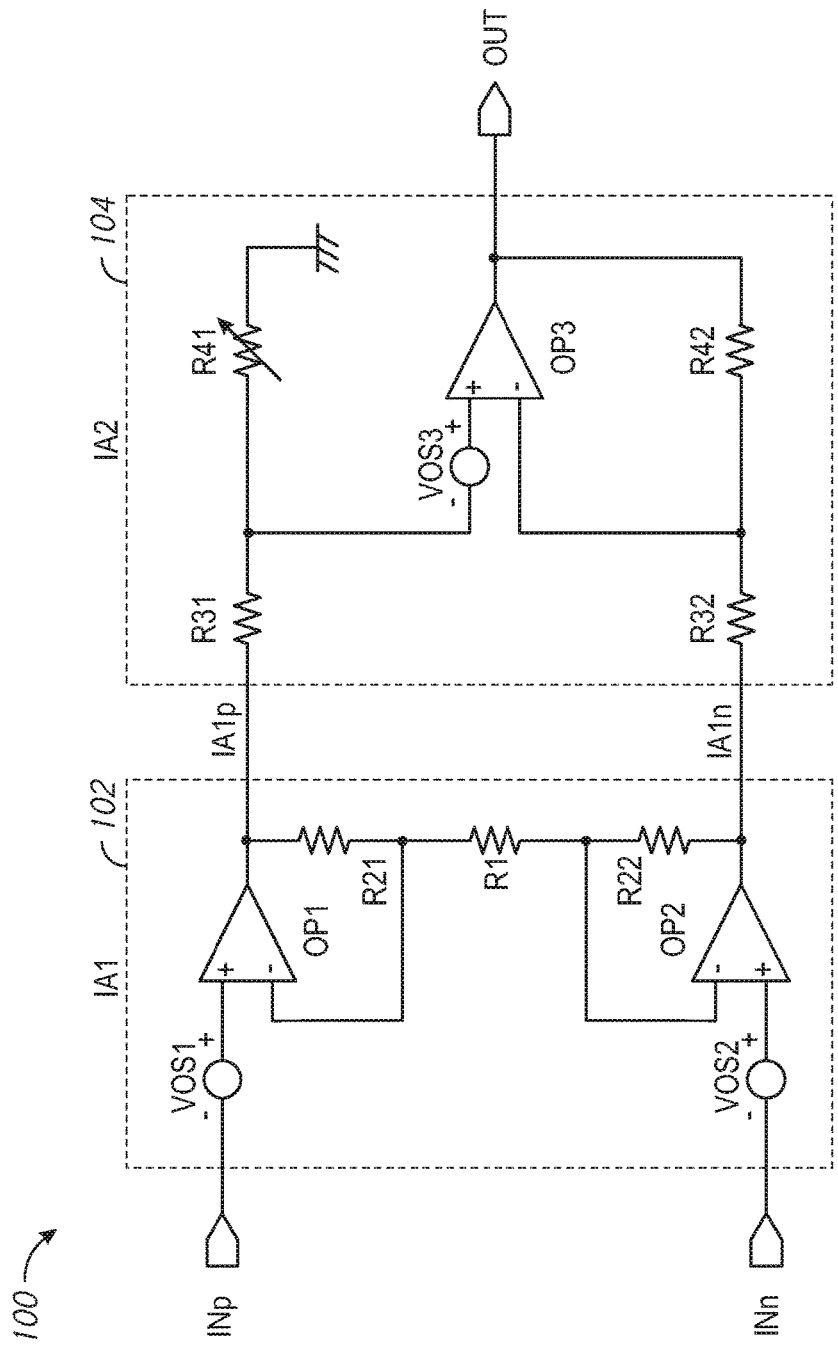
FIG. 1 is a schematic diagram of a prior art instrumentation amplifier.
Figure 2:
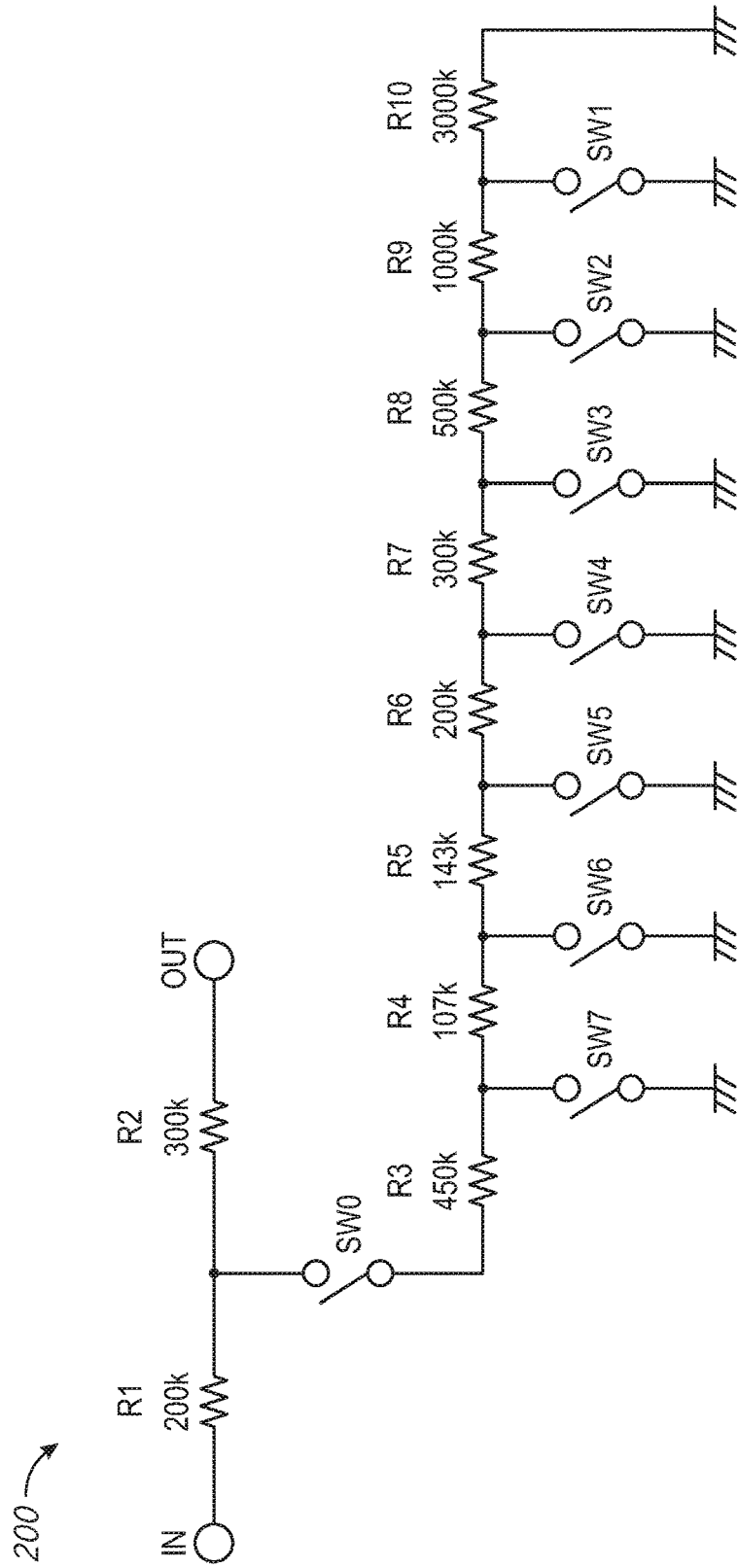
FIG. 2 is a schematic diagram of a prior art adjustable resistor.

A conventional instrumentation amplifier (e.g., amplifier 100 of FIG. 1) may have several limitations when used in such an application. As an example, if the current Im is 200 µA and the gain of the instrumentation amplifier is 25, then the amplifier may generate 1V of output voltage per 200 Ω of resistance on the TSV. If the Pass/Fail determination is set to an output level of 0.5 V, then accordingly a maximum of 100 Ω or higher of resistance along the TSV may be detected. However, it is to be noted that the designed resistance of a single TSV may be about 0.1 Ω. Thus, even a large number (e.g., ~8) of stacked TSVs may still have a total resistance of less than 1 Ω. Thus, a conventional instrumentation amplifier with a detection limit of 100 Ω may be too high for sensitive detection of resistance along the TSVs. In this application (TSV testing) it may be impractical to increase the current Im, since that would also increase the voltage Vm and the common mode voltage on the amplifier. Thus, it may be necessary to increase the gain of the amplifier. However conventional instrumentation amplifier may not be suitable for large gains (e.g., gains of above about 25).

Conventional instrumentation amplifier (e.g., instrumentation amplifier 100 of FIG. 1) uses an adjustable resistor (e.g., resistor 41) to cancel an offset voltage. If the gain of the amplifier is greatly increased, the assumption of equation 7 that Δ<<1 fails to hold, and equation 8 in turn becomes equation 10, below:

$$A2 \approx \left(\frac{R4}{R3}\right) - \left(\frac{R4}{2(R3+R4)}\right)\Delta \qquad \text{Eqn. 10}$$

Thus, increasing the overall gain of the circuit leads to a scenario where the adjustable resistor both cancels an offset and adjusts the gain of the circuit. This makes the circuit unsuitable for accurate measurements of resistance. Moreover, the offset cannot be accurately adjusted unless the common mode voltage Vcom is constant.

Figure 3:
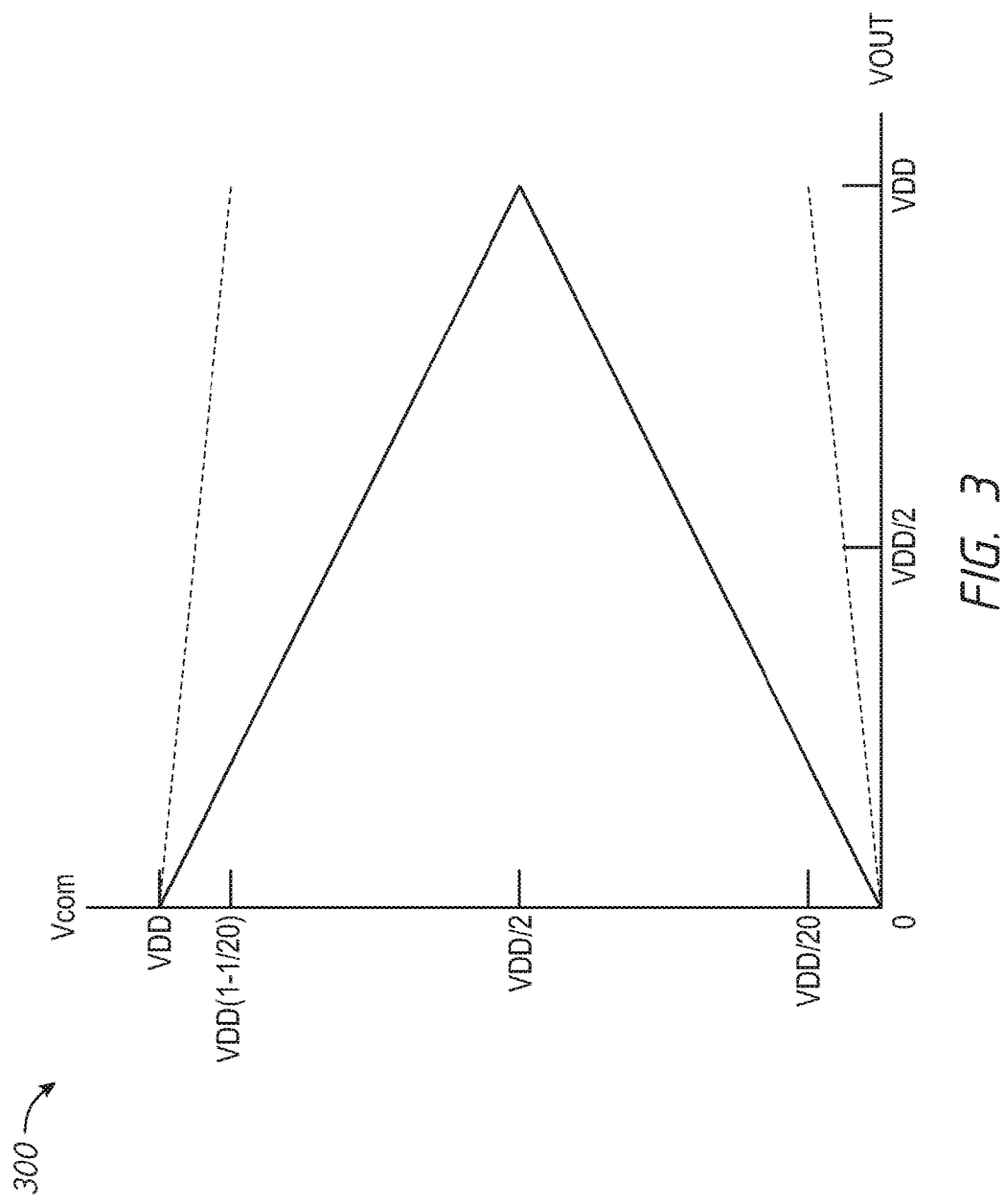
FIG. 3 is a diagram of operating characteristics for an instrumentation amplifier.

Another problem of increasing the gain of a conventional instrumentation amplifier may be seen by referring to the graph 300 of FIG. 3. The solid and dotted lines each enclose an area which is an operational range of the amplifier for a given configuration of gain. Both configurations have the same overall gain, but a different distribution of gain between the two stages (e.g., first amplifier 102 and second amplifier 104) of the circuit. Outside of the lines, the voltages between the first and second amplifier (e.g., voltages IA1p and IA1n) would exceed the rail voltages (e.g., Vdd and Vss) supplied to the instrumentation amplifier. Any portion of a waveform that would be above the rail voltages would maximize and 'clip' at these levels, distorting the shape of the waveform, and leading to non-desirable output characteristics.

Conventional instrumentation amplifiers (e.g., instrumentation amplifier 1 of FIG. 1), may be modified to cancel an offset by introducing a chopper circuit. However, this may cause greater problems, because the chopper circuit introduces a rectangular wave with an amplitude based on a gain factor times the offset sources VOS. As an example, an amplifier with a total gain of 100 is considered where the first amplifier 102 and the second amplifier 104 both have a gain of 10. If the input amplitude Vin=5 mV and the input offset voltages VOS1=VOS2=VOS3=5 mV, then the outputs IA1p and IA1n both have a rectangular wave superimposed with ±150 mV. Since the amplification factor Acom2 is 2, the output of the second amplifier 104 may be a rectangular wave with an amplitude of 1.055V and a common voltage of 0.5V. However, since one of the rails of the system may be set at ground (e.g., 0V) it may be seen that the rectangular output wave will be severely distorted due to rail voltage. This may lead to undesirable alteration of the output signal, even if the rectangular wave is later removed (e.g., with low pass filtering).

A chopper instrumentation amplifier may be a high-gain instrumentation amplifier which can cancel an offset voltage and still stably operate over a wide range of common mode input voltages. The chopper instrumentation amplifier may include multiple amplifier stages with chopper amplifiers. The chopper amplifiers may include chopper circuits to cancel an offset voltage by modulating the signal, and remove a square wave imposed by the chopper circuit by demodulating with subsequent switches. Low pass filters may be coupled to the outputs of one or more of the chopper amplifiers to remove a square wave that may be imposed by the chopper amplifiers. A final amplifier stage may include a non-chopper amplifier without a chopper circuit.

Figure 4:
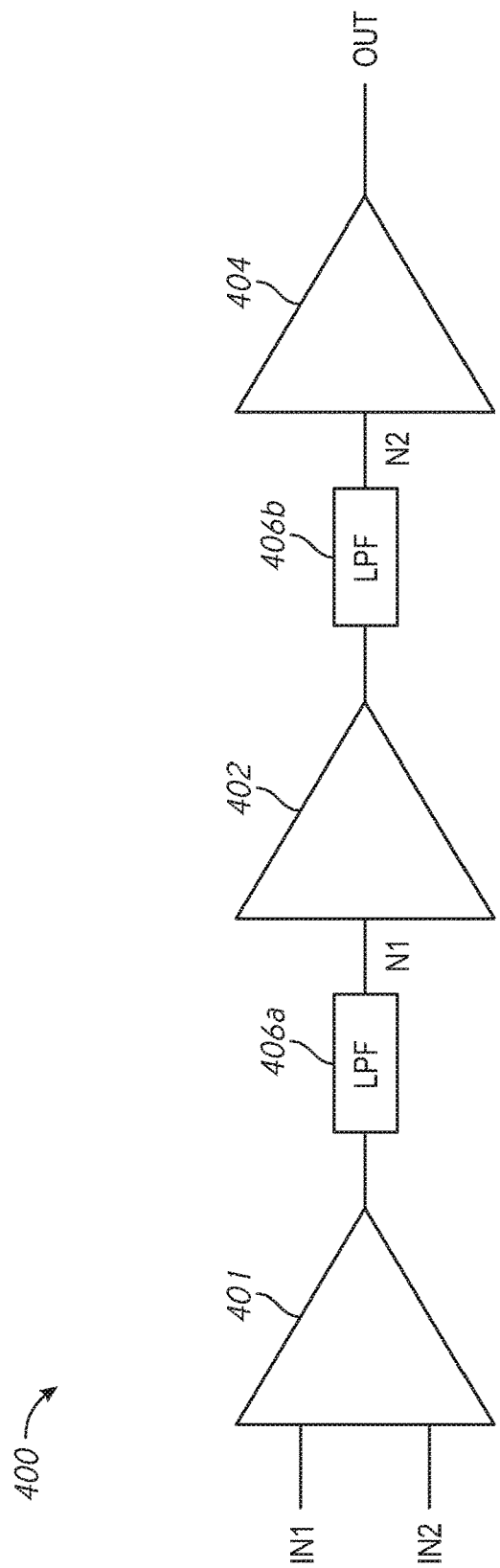
FIG. 4 is a schematic diagram of a chopper instrumentation amplifier according to an embodiment of the present disclosure.

FIG. 4 shows a chopper instrumentation amplifier according to an embodiment of the present disclosure. The chopper instrumentation amplifier 400 may include a first chopper amplifier 401 coupled to a pair of inputs IN1 and IN2. The first chopper amplifier 401 provides an output to a first intermediate node N1, which may be an input of second chopper amplifier 402. Second chopper amplifier 402 provides an output to second intermediate node N2, which may be an input of non-chopper amplifier 404. Non-chopper amplifier 404 provides an output signal OUT. In some embodiments, the chopper instrumentation amplifier 400 may also include low pass filters (LPFs) 406a-b, which may be coupled between an output of the chopper amplifiers 401, 402 and their respective intermediate nodes N1 and N2. In some embodiments, the chopper instrumentation amplifier 400 may include additional amplifiers, such as a third chopper amplifier between the second chopper amplifier 402 and the non-chopper amplifier 404.

The chopper amplifier 401 may amplify a signal across the inputs IN1 and IN2 to produce the output on the first node. The first chopper amplifier may include a chopper circuit to cancel an offset between the inputs IN1 and IN2. The chopper circuit may also impose a square wave on the output provided by the first chopper amplifier. The first chopper amplifier may be configured to amplify the signal, but not amplify the imposed square wave, such that the rectangular wave has a small effect on the amplified signal. The low pass filter 406a may filter the signal to remove all or part of the imposed rectangular wave. The low pass filter 406a may be a separate component between the first chopper amplifier 401 and the first intermediate node N1 or may be integrated into the first chopper amplifier 401.

The second chopper amplifier 402 and low pass filter 406b may generally work in the same manner as the first chopper amplifier 401 and low pass filter 406a. Similar to the low pass filter 406a, the low pass filter 406b may be a separate component, or may be integrated into the second chopper amplifier 402. The chopper amplifier 402 may receive a second input from the first chopper amplifier 401, or may receive an external input. In one embodiment, the external input may be a constant voltage such as a bias voltage. The first and second chopper amplifiers 401 and 402 may each include one or more chopper sub-amplifiers. The chopper sub-amplifiers may include chopper circuits.

The non-chopper amplifier 404 may amplify a signal provided on the second intermediate node N2 in order to provide the output signal OUT. The non-chopper amplifier 404 may be a differential amplifier, and may receive a second input signal. The second input signal may be provided from the second chopper amplifier 402. In some embodiments the second input signal may be an external input and may be the same external input as the external input of the second chopper amplifier 402. The non-chopper amplifier 404 may include one or more non-chopper sub-amplifiers. The non-chopper sub-amplifiers may generally be similar to the chopper sub-amplifiers of the chopper amplifiers 401, 402, except that the non-chopper sub-amplifiers do not include chopper circuits.

Although not shown in the simplified view of FIG. 4, the chopper amplifiers 401 and 402 and the non-chopper amplifier 404 may be coupled to power supply voltages. The power supply voltages may be provided by a component external to the chopper instrumentation amplifier 400. In some examples, the chopper instrumentation amplifier 400 may be coupled to a device for testing (e.g., a memory device for testing TSVs) and the power supply voltages may be provided by a power supply of the device. The power supply voltages may be a high voltage (e.g., Vdd) and a low voltage (e.g., Vss, ground). Each amplifier may be separately coupled to the power supply voltages, or they may be coupled to common rails.

The chopper circuits of the chopper amplifiers 401 and 402 and the low-pass filters 406a-b may be coupled to clock signals. The chopper amplifiers 401 and 402 may be coupled to a chopper clock signal, and the low-pass filters may be coupled to a LPF clock signal. The chopper clock signal and the LPF clock signal may be synchronized to each other. The chopper clock signal may include a pair of complementary clock signals, and the LPF clock signal may include a pair of clock signals each synchronized to one of the complementary clock signals. The clock signals may be generated and provided externally from the chopper instrumentation amplifier 400 (e.g., by a clock circuit).

The chopper instrumentation amplifier 400 may have an overall gain A which may be a combination of individual gains of each of the amplifiers 401, 402, and 404. For example, the first chopper amplifier has a gain A1, the second chopper amplifier 402 has a gain A2 and the non-chopper amplifier 404 has a gain A4. Since the amplifiers are coupled in series, the total gain may be a product of the gains (e.g., A=A1*A2*A4). In some examples, the gain of the non-chopper amplifier 404 may be less than the gains of the chopper amplifiers 401 and 402. In some embodiments the gain of the non-chopper amplifier 404 may be about one.

Figure 5:
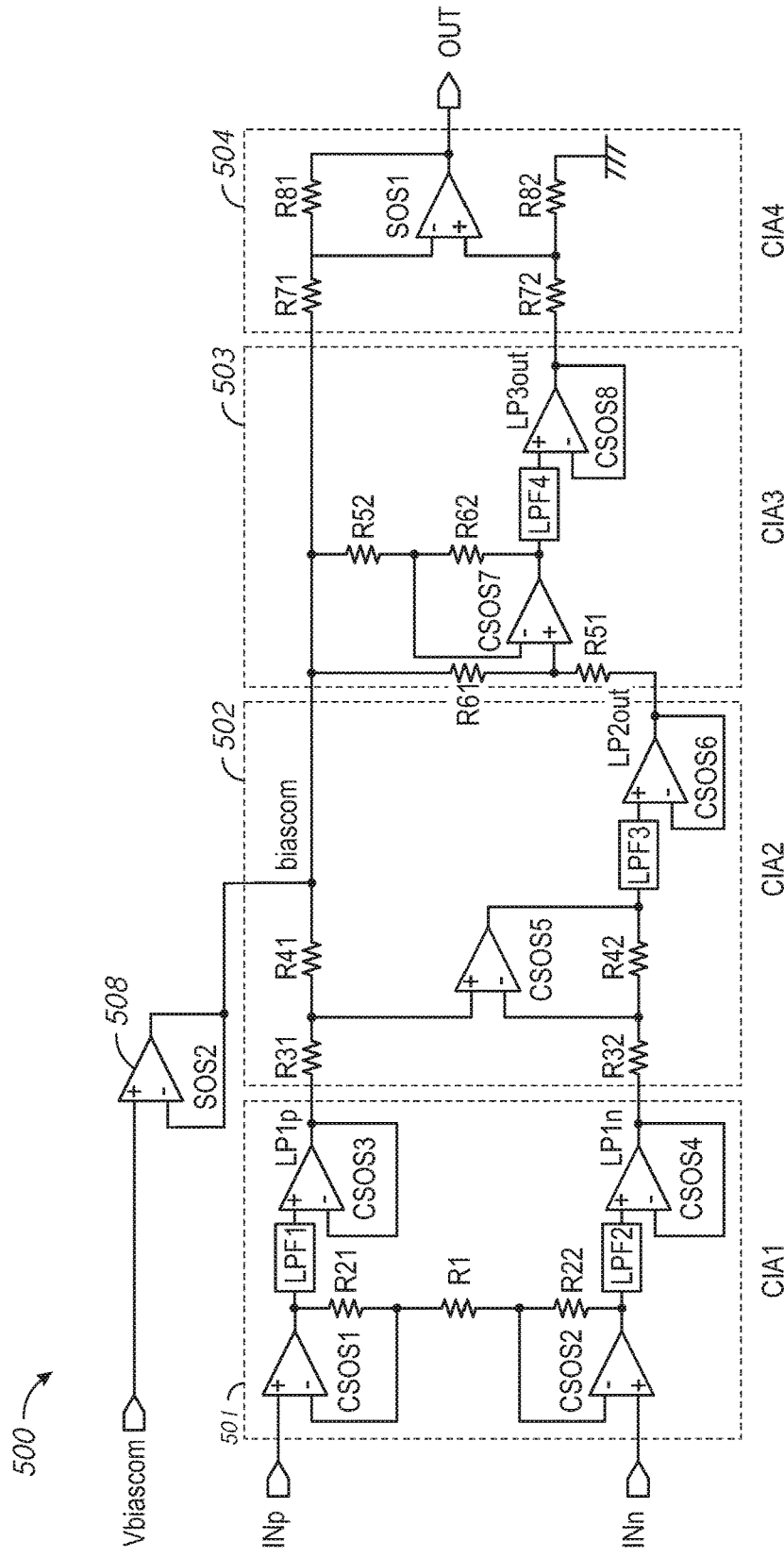
FIG. 5 is a schematic diagram of a chopper instrumentation amplifier according to an embodiment of the present disclosure.

FIG. 5 shows a chopper instrumentation amplifier 500 according to an embodiment of the present disclosure. The chopper instrumentation amplifier (CIA) 500 may receive a differential input INp and INn and provide an output OUT. The chopper instrumentation amplifier 500 may include a first amplifier 501, a second amplifier 502, a third amplifier 503, and a fourth amplifier 504. The chopper instrumentation amplifier 500 also may include a buffer circuit 508 which couples a bias voltage Vbiascom to the second, third, and fourth amplifiers 502-503. The first, second, and third amplifiers 501-503 may be chopper amplifiers, while the fourth amplifier 504 may be a non-chopper amplifier. The CIA 500 may, in some embodiments, be an implementation of the chopper instrumentation amplifier 400 of FIG. 4.

The first amplifier 501 receives input voltages INp and INn and provides a differential output LP1p and LP1n to a first intermediate node. The second amplifier 502 is coupled to the first intermediate node and provides an output LP2out to a second intermediate node. The third amplifier 503 is coupled to the second intermediate node and provides an output LP3out to a third intermediate node. The fourth amplifier 504 is coupled to the third intermediate node and provides the output voltage OUT.

Each of the amplifiers 501-504 may include one or more sub-amplifiers. The fourth amplifier 504 and the buffer circuit 508 may include symmetric operation-point self-biased amplifiers (SOS amplifiers). The SOS amplifiers are differential amplifiers similar to op-amps, and will be described in more detail in FIG. 6. The first, second, and third amplifiers 501-503 may include chopper-switch SOS amplifiers (CSOS amplifiers) which may generally be similar to the SOS amplifiers, but include chopper circuits. The CSOS amplifiers and chopper circuits are described in more detail in FIGS. 7 and 8 respectively. The CSOS amplifiers may function similarly to op-amps, however the chopper circuit may be used to cancel an input offset voltage input to the CSOS amplifier. The CIA 500 may also include low-pass filters (LPFs) described in detail in FIG. 9, which may remove the rectangular superimposed by the chopper circuit. The LPFs may function as the low-pass filters 406a-b of FIG. 4. In the example of FIG. 5, the LPFs are integrated into the amplifiers 501-503 rather than being separate components as shown in FIG. 4.

The first amplifier 501 is coupled to the input voltages INp and INn. The input voltage INp is coupled to the non-inverting input of a CSOS amplifier CSOS1, while the input voltage INn is coupled to the non-inverting input of an amplifier CSOS2. The outputs of CSOS1 and CSOS2 may be coupled together by resistors R21, R1, and R22 which are coupled in series between the outputs. The inverting input of CSOS1 may be coupled between resistors R21 and R1, while the inverting input of CSOS2 may be coupled between R1 and R22. The output of CSOS1 is coupled in series to LPF1 and to the non-inverting input of CSOS3. The output of CSOS2 is coupled in series to LPF2 and to the non-inverting input of CSOS4. CSOS3 provides an output voltage LP1p, which is coupled to the inverting input of CSOS3 and provided as an output of the amplifier 501. CSOS4 provides an output voltage LP1n, which is coupled to the inverting input of CSOS4 and provided as an output voltage of the first amplifier 501.

The first amplifier 501 amplifies the differential input potential (e.g., the difference between INp and INn) with a gain A1d that can be calculated by equation 11, below:

$$A1d = 1 + 2\left(\frac{R2}{R1}\right)$$ Eqn. 11

The resistors R21 and R22 are assumed to have equal resistances to each other, which is equal to R2. The first amplifier has a common mode amplification A1C (e.g., amplification of a voltage shared across INp and INn) of unity (e.g., A1C=1). Because the amplifiers CSOS1 and CSOS2 include chopper circuits, the input offset voltages on CSOS1 and CSOS2 are canceled. However, a rectangular wave with an amplitude equal to the input offset voltage multiplied by A1d (see equation 11) is superimposed on the output of CSOS1 and CSOS2. The low pass filters LPF1 and LPF2 may be used to reduce or remove the rectangular wave from the outputs of CSOS1 and CSOS2. The amplifiers CSOS3 and CSOS4 are used as voltage followers in order to boost the current along outputs LP1p and LP1n. Accordingly, the rectangular wave which uses input offset voltage of CSOS3 and CSOS4 as part of its amplitude remains superimposed on the outputs LP1n and LP1p, but the rectangular wave is not amplified by the first amplifier, and so may have a negligible impact on the second amplifier 502.

The second amplifier 502 receives the outputs LP1p and LP1n provided by the first amplifier 501 as inputs. The second amplifier 502 also receives bias voltage Vbiascom provided by buffer circuit 508. The buffer circuit 508 may act as a voltage follower, and may be an SOS amplifier, SOS2. A non-inverting input of SOS2 is coupled to the voltage Vbiascom, and the output Vbiascom is coupled to the inverting input of SOS2. The input LP1p is coupled to Vbiascom through two resistors R31 and R41 coupled in series. A non-inverting input of an amplifier CSOS5 is coupled between R31 and R41. The input LP1n is coupled to a low-pass filter LPF3 via two resistors R32 and R42 in series. The inverting input of CSOS5 is coupled between R32 and R42. The output of CSOS5 is coupled between R42 and LPF3. LPF3 provides a filtered output to a non-inverting input of amplifier CSOS6, which outputs a voltage LP2out which is coupled back to the inverting input of CSOS6. The second amplifier 502 provides the voltage Vbiascom as a first output voltage and LP2out as a second output voltage.

The second amplifier 502 amplifiers the differential between inputs LP1p and LP1n by a gain A2d given by equation 12 below:

$$A2d = \frac{R4}{R3} \quad \text{Eqn. 12}$$

The resistors R41 and R42 have an equal value of R4, and the resistors R31 and R32 have an equal value of R3. If there is no differential voltage between the inputs (e.g., LP1p–LP1n=0) then the output of the chopper amplifier CSOS5 is the bias voltage Vbiascom. In that scenario, the input offset voltage of the CSOS5 is amplified by a gain of A2os, which is given by equation 13, below:

$$A2os = 1 + \frac{R4}{R3} \quad \text{Eqn. 13}$$

The amplified input offset voltage is superimposed on the output of CSOS5 as a rectangular wave. The low-pass filter LP3 may remove the amplified input offset voltage. The amplifier CSOS6 may be used as a voltage follower to drive current on the output. The rectangular wave applied by the chopper circuit of CSOS6 is superimposed on the output voltage LP2out. However, since this wave was not amplified, its effect on the third amplifier 503 may be negligible.

The third amplifier 503 receives the outputs of the second amplifier 502, Vbiascom and LP2out as inputs. The third amplifier 503 may couple the Vbiascom to LP2out with two resistors R61 and R51 coupled in series. A chopper amplifier CSOS7 may have a non-inverting input which is coupled between R61 and R51. The amplifier CSOS7 may provide an output which is coupled to a low-pass filter LPF4 and also coupled to Vbiascom via two resistors R62 and R52 which are coupled in series. An inverting input of CSOS7 is coupled between resistors R52 and R62. The filtered output of the low-pass filter LPF4 is coupled to a non-inverting input of a chopper amplifier CSOS8, which provides an output voltage LP3out. The inverting input of CSOS8 is coupled to the output LP3out. The third amplifier 503 provides the bias voltage Vbiascom and LP3out as outputs.

The third amplifier 503 may be generally similar to the second amplifier 502, except that the third amplifier 503 has a chopper amplifier CSOS7 in which both the inverting and non-inverting inputs are coupled to the bias voltage Vbiascom (via resistors R52 and R61 respectively). The input of the chopper amplifier CSOS7 is the differential between Vbiascom and LP2out, and the output is expressed by the differential gain A3d given by equation 14 below:

$$A3d = \frac{R6}{R5} \quad \text{Eqn. 14}$$

In the third amplifier 503, the resistors R61 and R62 may have values equal to R6, while the resistors R51 and R52 may have values equal to R5. The common mode voltage that is output by the third amplifier may be Vbiascom. The chopper amplifier CSOS7 provides an output with a superimposed rectangular wave with an amplitude determined by the input offset voltage of CSOS7 and amplified by a gain of A3os given by equation 15 below:

$$A3os = \left(1 + \frac{R6}{R5}\right) \quad \text{Eqn. 15}$$

In order to remove this amplified rectangular wave, the output of chopper amplifier CSOS7 is provided to a low-pass filter LPF4, which strips the rectangular wave from the amplified signal. The low-pass filter LPF4 then provides the stripped amplified signal to a second chopper amplifier CSOS8, which acts as a voltage follower. The chopper amplifier CSOS8 also applies a rectangular wave on the output signal, however it is not amplified, and so may have a negligible impact on the fourth amplifier 504.

The fourth amplifier 504 receives the outputs of the third amplifier, Vbiascom and LP3out, as inputs. The fourth amplifier 504 may couple the input voltage LP3out to ground through resistors R72 and R82 coupled in series. A non-inverting input of an amplifier SOS1 is coupled between the resistors R72 and R82. The amplifier SOS1 provides an output OUT, is coupled to the input Vbiascom via two resistors R81 and R71 which are coupled in series. An inverting input of the amplifier is coupled between the resistors R71 and R81. The output voltage OUT is provided as the output of the fourth amplifier 504.

The fourth amplifier 504 may have a differential gain of Ad4 which is applied to the potential difference between LP3out and Vbiascom, and given by equation 16 below:

$$Ad4 = \left(\frac{R8}{R7}\right) \qquad \text{Eqn. 16}$$

In the fourth amplifier 504, the resistors R71 and R72 may have a value equal to R7, and the resistors R81 and R82 may have a value of R8. The fourth amplifier may provide a common mode voltage of 0V. The amplifier SOS1 may not include a chopper circuit and may increase the input offset by a gain of A4os, given by equation 17 below:

$$A4os = \left(1 + \frac{R8}{R7}\right) \qquad \text{Eqn. 17}$$

The amplified offset voltage provided by the amplifier SOS1 may remain as an error of the output voltage OUT. The superimposed (unamplified) rectangular wave that was superimposed on LP3out by voltage follower CSOS8 of the third amplifier 503 may remain on the output voltage OUT. However, the superimposed rectangular wave may be small in magnitude compared to the signal on the output voltage OUT, and may be a 'ripple' on the signal.

Accordingly, overall the amplifier 500 receives a differential input INp and INn and amplifies it by an overall differential gain A to provide the output voltage OUT. The overall differential gain A may be found by multiplying the differential gains of each of the amplifiers 501-504, and is given by equations 18 and 19, below:

$$A = A1d*A2d*A3d*A4d \qquad \text{Eqn. 18}$$

$$A = \left(1 + 2\left(\frac{R2}{R1}\right)\right)\left(\frac{R4}{R3}\right)\left(\frac{R6}{R5}\right)\left(\frac{R8}{R7}\right) \qquad \text{Eqn. 19}$$

From equation 19, it may be seen that the overall amplification of the differential signal is determined by the resistor values R1-R8 which are chosen. These values may be selected based on the desired application and the desired operating characteristics of the amplifier. In some embodiments, the gain of each of the stages (amplifiers 501-504) may be kept low. By keeping the gain of each stage low, the amplitude of the rectangular wave resulting from the input offset voltage is also kept relatively low. This may prevent the waveforms of the amplifier 500 from reaching the rail voltages (e.g., Vdd and Vss) and distorting the waveform. The low pass filters (e.g., LPF-LPF4) and the voltage followers (e.g., CSOS3, CSOS4, CSOS6, and CSOS8) may reduce the output ripple imposed by the first three stages 501-503 to an amount equivalent to the input offset of each voltage follower. This may reduce a risk of the waveform being deformed by subsequent stages of the chopper instrumentation amplifier 500.

The allowable common mode voltage (e.g., the range of common mode voltages that do not lead to any distortion of the waveform due to clipping on the rail voltages) of the chopper instrumentation amplifier 500 may span almost the full range of the rail voltages (e.g., from approximately Vdd to approximately ground). Low gain at the first stage 501 may be dispersed by low gain of the subsequent stages 502-503.

In one example, the total gain A may be about 125. Higher or lower total gains are possible in other examples. In the example where the total gain A is 125, the resistor values R1-R8 may be set such that A1d=5, A2d=5, A3d=5, and A4d=1. Other gains and other distributions of gains between the amplifiers 501-504 may be used in other examples. The gain of the final stage may be set to unity (e.g., A4d=1) which allows error voltages to be close to 0V, since the output waveform and its deformation are not increased by the fourth amplifier 504. In this example, the input common mode voltage may be between Vdd*(1/50) and Vdd*(1−1/50). Thus in this configuration the range of allowable common mode voltages is between 98% of Vdd and 2% of Vdd. In other examples, the gain of the final stage (e.g., fourth amplifier 504) may be greater than unity.

As an example application of the chopper instrumentation amplifier 500, the chopper instrumentation amplifier 500 may be used to amplify a voltage Vm from TSV testing. The chopper instrumentation amplifier 500 may be configured as previously described such that the gains of amplifiers 501-503 are 5, and the gain of amplifier 504 is 1. If a maximum input offset of the CIA 500 is assumed to be 10 mV, then the input offset which appears at the output is 20 mV (10 mV*A4os=10 mV*2). The 20 mV offset is the result of input offset of amplifier SOS1 of the fourth amplifier 504. The offset error equivalent can be found to be 160 µV (20 mV/125) when the offset is converted to the input. Only a rectangular wave with the amplitude of 10 mV at maximum is superimposed, so that the output ripple containing the error resulting from that superimposition is an offset of 240 µV (30 mV/125) converted to the input. In the TSV testing scenario, a current of 200 µA may be driven through the TSV. If the TSV has a resistance of 10 Ω, then the voltage Vm is 2 mV. The error caused by the 240 µV of offset is thus 1.2 Ω. Thus, the CIA 500 may be sensitive enough to measure small (e.g., ~10 Ω) resistances in a TSV.

Although a specific implementation of the chopper instrumentation amplifier 500 was described in FIG. 5, it is to be understood that the configuration of the amplifier 500 may be changed in other implementations. For example, the third amplifier 503 may be omitted from the chopper instrumentation amplifier 500. In that example the second amplifier 502 may provide voltages Vbiascom and LP2out to the resistors R71 and R72 (respectively) of the fourth amplifier 504.

Figure 6:
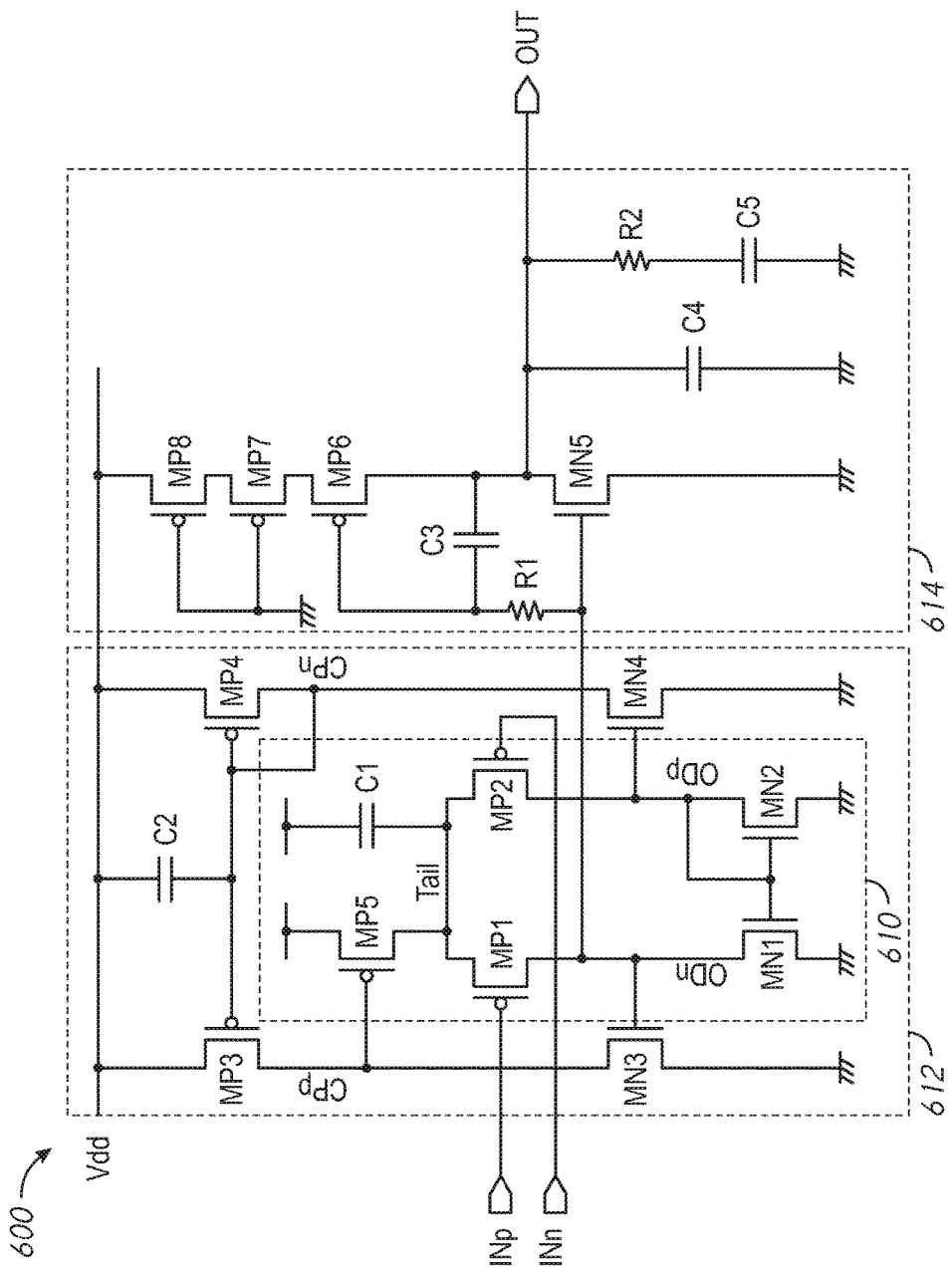
FIG. 6 is a schematic diagram of a non-chopper amplifier according to an embodiment of the present disclosure.

FIG. 6 shows a non-chopper amplifier (an SOS amplifier) 600 according to an embodiment of the present disclosure. The SOS amplifier 600 may, in some embodiments, be used as the amplifiers SOS1-SOS2 of FIG. 4. The SOS amplifier 600 may function as a differential amplifier and amplify a potential difference across two inputs INp and INn. The SOS amplifier 600 may provide an output voltage OUT which is based on the inputs INp and INn. The SOS amplifier 600 includes a main amplifier 610, a sub amplifier 612, and an output stage 614. The main amplifier 610 is coupled to the input voltages INp and INn and provides an output to the output stage 614, which provides the output voltage OUT. The main amplifier 610 may be coupled to the sub amplifier 612, which may provide feedback to regulate the voltages on the main amplifier 610. While FIG. 6 may show a specific implementation of the SOS amplifier 600, it is to be understood that variations may be made to the layout and components of the SOS amplifier 600 without departing from the present disclosure.

The main amplifier 610 includes transistors MN1, MN2, MP1, MP2, and MP5 as well as a capacitor C1. The gate of transistor MP1 is coupled to INp while the gate of transistor MP2 is coupled to INn. The sources of the transistors MP1 and MP2 may be coupled together by a tail voltage Tail. Tail is coupled to a source voltage Vdd through capacitor C1 and to the drain of transistor MP5. The drain of transistor MP1 is coupled to a voltage ODn, and the drain of transistor MP2 is coupled to a voltage ODp. The gates of transistors MN2 and MN1 are coupled together, and are coupled to the voltage ODp. The drain of transistor MN2 is coupled to the voltage ODp and the drain of the transistor ODn is coupled to transistor MN1. The sources of both transistors MN1 and MN2 are both coupled to ground. The voltages ODn and ODp are provided as outputs of the main amplifier 610 and as inputs of the sub amplifier 612. The voltage ODn is additionally provided as an input to the output stage 614.

The sub amplifier 612 may maintain a relationship of the voltages ODp and ODn within the main amplifier 610. The sub amplifier includes transistors MN3, MN4, MP3, and MP4 as well as a capacitor C2. The gates of transistors MN3 and MN4 are coupled to input voltages ODp and ODn. The sources of transistors MN3 and MN4 are both coupled to ground, while their drains are coupled to voltages CPp and CPn respectively. The voltages CPp and CPn are coupled to the drains of transistors MP3 and MP4 respectively. The sources of the transistors MP3 and MP4 are coupled to a source voltage Vdd. The gates of the transistors MP3 and MP4 are coupled together, are coupled to the source voltage Vdd through capacitor C2, and are coupled to the voltage CPn. The voltage CPp is also coupled to the gate of transistor MP5 of the main amplifier 610.

The sub amplifier 612 may control the gate bias of transistor MP5 in order to keep the voltage of ODp and ODn equal to each other. Keeping the voltages ODp and ODn equal also leads to the voltages CPp and CPn being equal. Thus, the transistor pairs MN1 and MN2 and MP1 and MP2 operate at the same operating point. In this manner the system offset voltage is minimized. In some examples, the system offset may be ±50 μV or less, even over a wide range of input voltages in a state where device dispersion does not exist.

The output stage 614 is provided the voltage ODn as an input, and amplifies it to an output voltage OUT. The output stage 614 may include transistors MN5, MP6, MP7, and MP8, resistors R1 and R2, and capacitors C3, C4, and C5. The input voltage ODn is coupled to the gate of transistor MN5, which has a source coupled to ground, and a drain coupled to the output voltage OUT. The input voltage ODn is also coupled to the output voltage OUT via a resistor R1 and capacitor C3 coupled in series. The output voltage OUT is also coupled to ground via a capacitor C4 and coupled to ground via a resistor R2 and capacitor C5 coupled in series. A series of transistors MP8 to MP6 is coupled such that a drain of MP8 is coupled to the source of MP7 and a drain of MP7 is coupled to a source of MP6. The drain of MP6 is coupled to the output voltage OUT. The source of MP8 is coupled to the source voltage Vdd. The gates of MP8 and MP7 are coupled to ground. The gate of MP6 is coupled between the resistor R1 and the capacitor C3.

Figure 7:
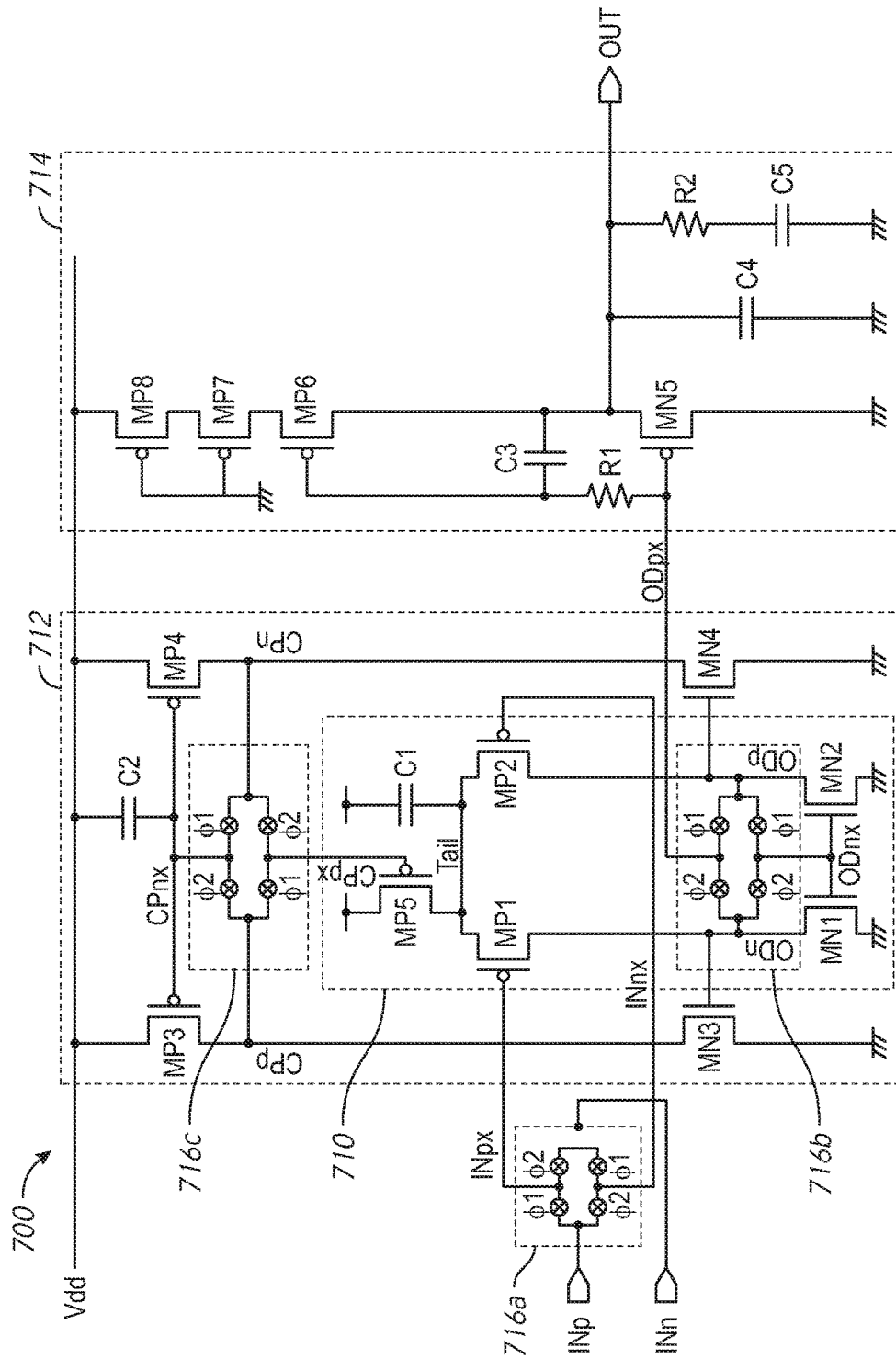
FIG. 7 is a schematic diagram of a chopper amplifier according to an embodiment of the present disclosure.

FIG. 7 shows a chopper amplifier (a CSOS amplifier) 700 according to embodiments of the present disclosure. The chopper amplifier 700 may be used, in some embodiments, to implement the chopper amplifiers CSOS1-CSOS8 of the chopper instrumentation amplifier 500 of FIG. 5. The CSOS amplifier 700 includes a main amplifier 710, a sub amplifier 712, and an output stage 714. In addition, the CSOS amplifier 700 also includes chopper circuits 716a-c. The chopper amplifier 700 may be generally similar to the SOS amplifier 600 of FIG. 6 except for the addition of chopper circuits 716a-c between the input and the main amplifier 710 and in the main amplifier 710 and sub amplifier 712. For the sake of brevity, features and components that were previously described in regards to FIG. 6 will not be described again.

The CSOS amplifier 700 includes a first chopper circuit 716a which is positioned between the input voltages INp and INn and the main amplifier 710. The first chopper circuit 716a receives the inputs INp and INn and provides outputs INpx and INnx to the respective gates of transistors MP1 and MP2 of the main amplifier 710. The second chopper circuit 716b is inserted in the main amplifier 710 and is coupled to voltages ODn and ODp as inputs. The second chopper circuit provides a voltage ODnx which is coupled to the gates of transistors MN1 and MN2, and also provides a voltage ODpx which is provided to the output stage 714 as an output of the main amplifier 710. The third chopper circuit 716c is coupled to the sub amplifier 712 and receives the voltages CPp and CPn as inputs. The third chopper circuit 716c provides an output voltage CPnx which is coupled to the gates of transistors MP3 and MP4 and also coupled to a source voltage Vdd via capacitor C2. The third chopper circuit 716c also provides a voltage CPpx which is coupled to the gate of transistor MP5 of the main amplifier 710.

The chopper circuits 716a-c may receive a first and second input, and provide a first and second output. The chopper circuits 716a-c may vary in time such that they alternate providing the first input voltage as the first input and the second input voltage as the second output with providing the first input voltage as the second output and the second input voltage as the first output. The coupling of the inputs to the outputs may vary in time at a rate based on clock signals $\phi1$ and $\phi2$. The clock signals $\phi1$ and $\phi2$ may be provided from outside the CSOS amplifier 700. Because the CSOS amplifier 700 is a differential amplifier, the use of the chopper circuits to alternate inputs may reduce or cancel the input voltage offset by making it appear on both input terminals of the CSOS amplifier 700.

The first chopper circuit 716a may act as a modulation switch, while the second and third chopper circuits 716b, 716c may act as demodulation switches. The chopper circuits 716a-c may each receive clock signals $\phi1$ and $\phi2$. The clock signals may have a frequency which may be used by the chopper circuit to up-converge the input offset and the input signal to the odd-order frequency of the clock signal. The demodulation switches may then remove these frequency components by down-converging the voltages that have been amplified by the CSOS amplifier 700. The demodulation chopper circuits 716b and 716c are coupled to ODn and ODp and to CPp and CPn respectively. As with the amplifier 600 of FIG. 6, the voltages ODn and ODp are kept equal to each other, and the voltages CPp and CPn are kept equal to each other. In this manner, if an input offset is zero, the voltages do not change before and after the chopper circuit is activated by the clock signals. By keeping the voltages equal at the chopper circuits 716b and 716c, a transient output error from switching of the chopper circuit is reduced.

Figure 8:
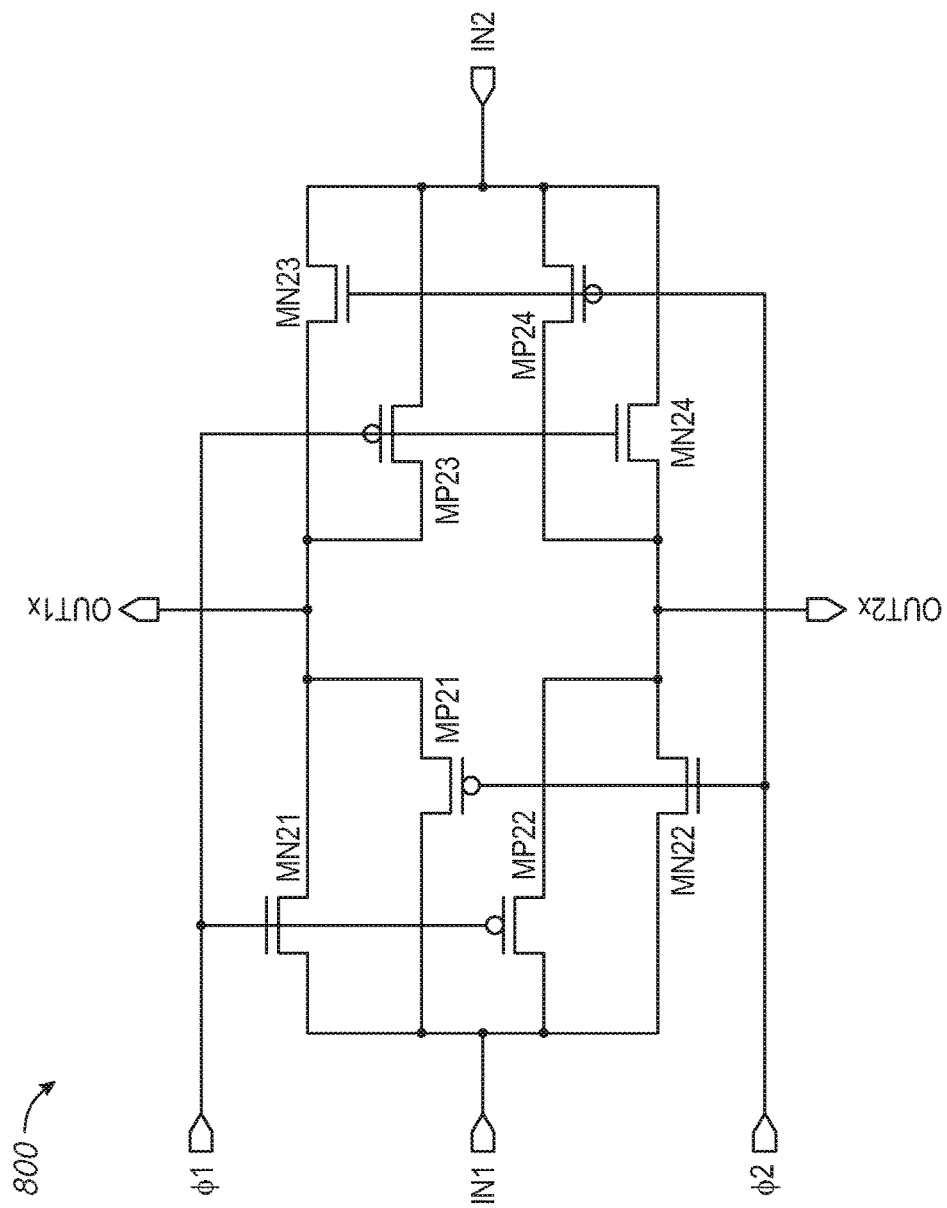
FIG. 8 is a schematic diagram of a chopper circuit according to an embodiment of the present disclosure.

FIG. 8 shows a chopper circuit 800 according to an embodiment of the present disclosure. The chopper circuit 800 may be used, in some embodiments, to implement the chopper circuits 716a-c of FIG. 7. The chopper circuit 800 may be a chopper switch in some embodiments. The chopper circuit 800 includes transistors MN21-MN24 and MP21-MP24 which act as analog switches. The chopper circuit 800 receives a first clock signal $\phi1$ and a second clock signal $\phi2$, which is complimentary to the first clock signal $\phi1$. The chopper circuit also receives a first and second input voltage IN1 and IN2, and outputs corresponding output voltages OUT1x and OUT2x.

The clock signal φ1 may be coupled to a gate of transistors MN21, MP22, MP23, and MN24 to operate them as switches. The clock signal φ2 may be coupled to a respective gate of transistors MN22, MP21, MP24, and MN23 to operate them as switches. The chopper circuit 700 may have two similar sides which may generally be symmetric to each other. The first side may include MN21, MP21, MP22, and MN22 and may selectively couple the first input IN1 to the first output OUT1x and the second output OUT2x. The second side may include transistors MN23, MP23, MP24, and MN24 and may selectively couple the second input IN2 to the first output OUT1x and the second output OUT2x. Because the circuit may generally be symmetrical, only the coupling of the first side will be described in detail. However it is to be understood that analogous connections may also exist on the second side.

The first input voltage IN1 is coupled to the first output OUT1x via two transistors MN21 and MP21 in parallel, and is coupled to the second output OUT2x via two transistors MP22 and MPN22 coupled in parallel. The first input voltage IN1 is coupled to the source of transistor MP21 and to the drain of transistor MN21. The drain of MP21 and the source of MN21 are coupled to the output OUT1x. The first input IN1 is also coupled to the drain of MP22 and to the source of MN22. The source of MP22 and the drain of MN22 are coupled to the second output OUT2x. The gates of MN21 and MP22 are coupled to clock signal φ1, while the gates of MP21 and MN22 are coupled to clock signal φ2. Since the two clock signals are complimentary to each other (e.g., when φ1 is a 'high' level, φ2 is a 'low' level and vice versa), the transistors MN21 and MP21 are activated together when the transistors MP22 and MN22 are inactive, and the transistors MP22 and MN22 are activated together when the transistors MN21 and MP21 are inactive. In a similar fashion, transistors MN23 and MP23 are activated together and MP24 and MN24 are activated together. The four pairs of transistors activate such that MN21, MP21, MP24 and MN24 are active when MP22, MN22, MN23, and MP23 are inactive and vice versa. In this manner, the chopper circuit 700 alternates providing IN1 on OUT1x and IN2 on OUT2x with providing IN1 on OUT2x and IN2 on OUT1x. The alternation may occur at a frequency f of the clock signals φ1 and φ2.

Figure 9:
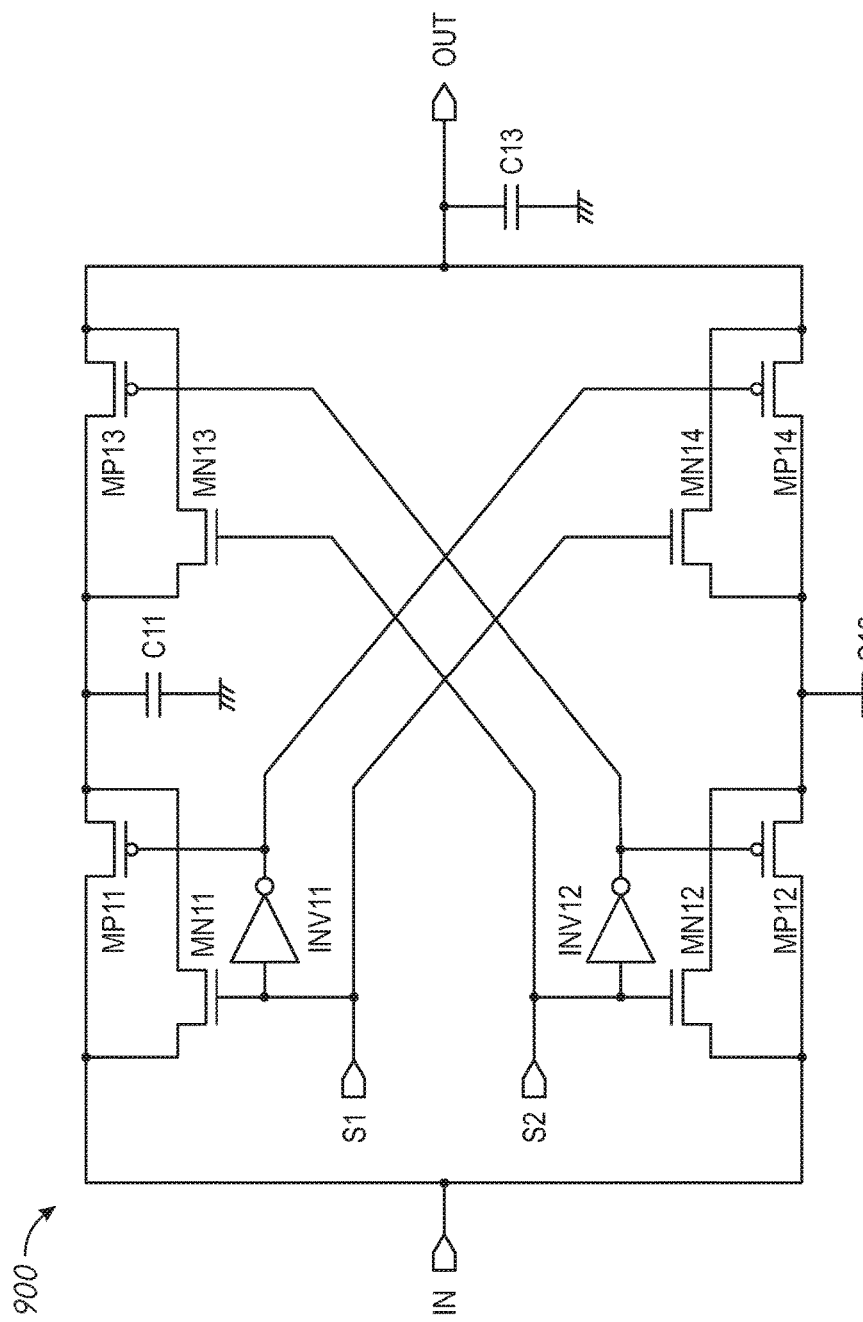
FIG. 9 is a schematic diagram of a low-pass filter according to an embodiment of the present disclosure.

FIG. 9 shows a low pass filter 900 according to an embodiment of the present disclosure. The low pass filter 900 may be used to implement, in some embodiments, one or more of the low pass filters LPF1-LPF4 of the chopper instrumentation amplifier 500 of FIG. 5. The low pass filter receives an input signal IN and provides an output signal OUT. The low pass filter may have a transfer function which permits low frequency signal components and blocks high-frequency signal components. The low-pass filter 900 may be synchronized with the chopper circuits and may remove the rectangular waves imposed by the chopper circuits.

The low-pass filter 900 receives an input signal IN and two clock signals S1 and S2 as inputs and provides an output signal OUT. The clock signals S1 and S2 may have the same frequency as the clock signals φ1 and φ2. In some embodiments the clock signals S1 and S2 may be provided by the same component which provides the clock signals φ1 and φ2 (e.g., a clock circuit). The low pass filter 900 includes transistors MP11-MP14 and MN11-MN14 which may act as switches, capacitors C11-C13, and inverters INV11 and INV12. The input signal IN may be coupled to the output OUT by two circuit paths in parallel. The circuit paths may generally be symmetric to each other. One of the two circuit paths involves transistors MP11, MN11, MP13, and MN13 as well as INV11 and C11 while the other path involves MN12, MP12, MN14, MP14, INV12, and C12. For the sake of brevity, only one circuit path will be described in detail.

The input signal IN is coupled to the source of MP11 and the drain of MN11. The gate of MN11 is coupled to the clock signal S1, while the gate of MP11 is coupled to an inverse of the clock signal S1 (via inverter INV11). The drain of MP11 is coupled to the source of MN11, which are coupled to ground via the capacitor C11. The coupled drain and source of MP11 and MN11 respectively are coupled to the source of MP13 and the drain of MN13. The gate of MN13 is coupled to the clock signal S2, while the gate of MP13 is coupled to an inverse of the clock signal S2 (provided by the inverter INV12). The drain of MP13 is coupled to the source of MN13 and both are coupled to the output voltage OUT. The output voltage OUT is also coupled to ground via capacitor C13. The two capacitors C11 and C12 may be equal in capacitance. The capacitors C11 and C12 may have an equivalent resistance of R, given by equation 20, below:

$$R = \frac{1}{(C11*f)} \qquad \text{Eqn. 20}$$

The frequency of the clock signals S1 and S2 may be f. The overall cutoff frequency of the low pass filter 900 may be given by equation 21, below:

$$fc = \frac{1}{\left(2\pi\left(\frac{R}{2}\right)C13\right)} = f*\frac{C11}{(\pi*C13)} \qquad \text{Eqn. 21}$$

Figure 10:
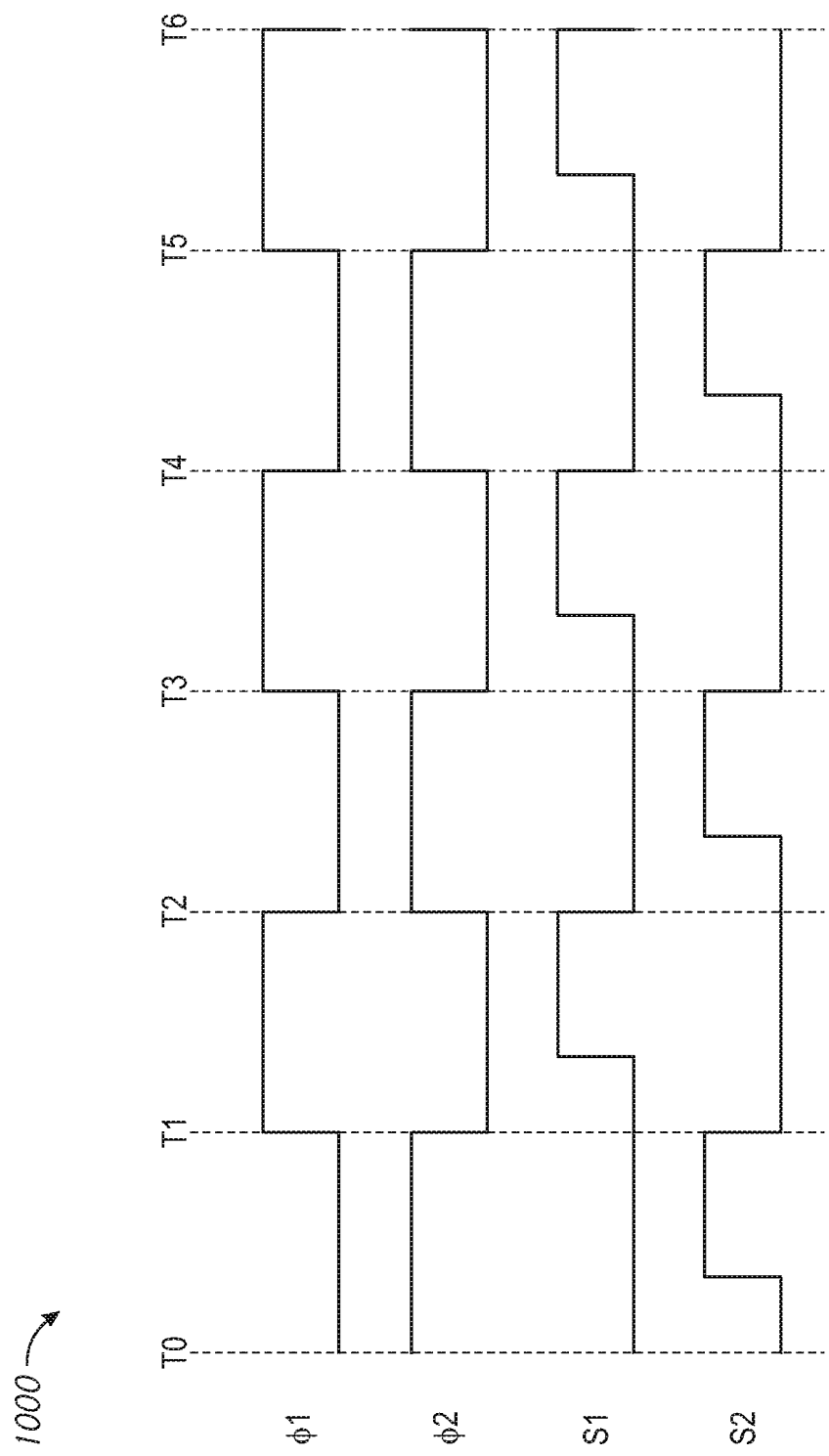
FIG. 10 is a timing diagram of signals for operation of a chopper instrumentation amplifier according to an embodiment of the present disclosure.

FIG. 10 is a timing diagram of signals for operation of a chopper instrumentation amplifier according to an embodiment of the present disclosure. The timing diagram 1000 shows waveforms over time of the clock signals φ1, φ2, S1, and S2 that are provided to the chopper circuit (e.g., chopper circuit 800 of FIG. 8) and low pass filter (e.g., low pass filter 900 of FIG. 9). The clock signals φ1, φ2, S1, and S2 may be generated by a component external to the chopper instrumentation amplifier (e.g., a clock circuit of a semiconductor memory). The timing diagram 1000 is not shown with labels on the x-axis (time) or y-axis (voltage) because it is understood that such values may change depending on the application or specific implementation of the circuit. For example, the clock signals may have different values for 'high' and 'low' voltages.

The top two lines of the timing diagram 1000 show the clock signals φ1 and φ2. The clock signals may be rectangular waves which periodically alternate between a 'high' level (e.g. a first voltage) and a 'low' level (e.g., a second voltage or a ground voltage) at a frequency f. The first clock signal φ1 starts at a low level, and switches to a high level at time T1. At each time T2-T6, the signal switches voltage levels. The second clock signal φ2 is a complement of the first clock signal φ1. Accordingly, the second clock signal φ2 starts at a high level and decreases to a low level at T1 and then alternates at each time T2-T6 afterwards.

The bottom two lines of the timing diagram 1000 show the clock signals S1 and S2. S1 may be synchronized to φ1 and S2 may be synchronized to φ2. The clock signals S1 and S2 may transition from a low to a high voltage at some time after the synchronized clock signal φ1, φ2 does, but may transition from high back to low at the same time as the synchronized clock signal φ1, φ2. The operation of S1 and φ1 will be described, however it is to be understood that the same description may apply to S2 and φ2, but offset in time.

From time T0 to T1, the signal φ1 is at a low voltage, and so the signal S1 is also at a low voltage. At time T1 the signal φ1 switches from a low voltage to a high voltage, but at T1 S1 remains at the low voltage. At some time after T1, the clock signal S1 switches to a high voltage. At time T2 the clock signal φ1 switches back to a low voltage, and so the clock signal S1 also transitions back to a low voltage. The signals S1 and S2 may be delayed relative to φ1 and φ2 in order to allow a transient voltage imposed by the chopper circuit to stabilize before the waveform is sampled by the low pass filter (e.g., low pass filter 900 of FIG. 9).

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An instrumentation amplifier comprising:
a pair of input terminals;
first and second intermediate nodes;
an output terminal;
a first amplifying stage coupled between the pair of input terminals and the first intermediate node, the first amplifying stage comprises a first chopper amplifier;
a second amplifying stage coupled between the first intermediate node and the second intermediate node, the second amplifying stage comprises a second chopper amplifier; and
a third amplifying stage coupled between the second intermediate node and the output terminal, the third amplifying stage comprises a non-chopper amplifier;
wherein a gain of the first amplifying stage is greater than a gain of the third amplifying stage and a gain of the second amplifying stage is greater than the gain of the third amplifying stage,
wherein the pair of input terminals comprises a first input terminal and a second input terminal, and
wherein the first chopper amplifier comprises a first sub-chopper amplifier and a second sub-chopper amplifier, the first sub-chopper amplifier being coupled to the first input terminal, and the second sub-chopper amplifier being coupled to the second input terminal.

2. The instrumentation amplifier of claim 1, wherein the gain of the third amplifying stage is approximately one.

3. The instrumentation amplifier of claim 1,
wherein the first amplifying stage further comprises a first low-pass-filter (LPF) circuit coupled to an output of the first chopper amplifier; and
wherein the second amplifying stage further comprises a second LPF circuit coupled to an output of the second chopper amplifier.

4. An instrumentation amplifier comprising:
a pair of input terminals;
first and second intermediate nodes;
an output terminal;
a first amplifying stage coupled between the pair of input terminals and the first intermediate node, the first amplifying stage comprises a first chopper amplifier;
a second amplifying stage coupled between the first intermediate node and the second intermediate node, the second amplifying stage comprises a second chopper amplifier;
a third amplifying stage coupled between the second intermediate node and the output terminal, the third amplifying stage comprises a non-chopper amplifier, wherein a gain of the first amplifying stage is greater than a gain of the third amplifying stage and a gain of the second amplifying stage is greater than the gain of the third amplifying stage; and
at least one additional amplifying stage inserted between the second amplifying stage and the third amplifying stage, the at least one additional amplifying stage comprising a third chopper amplifier,
wherein a gain of the at least one additional amplifying stage is greater than the gain of the third amplifying stage.

5. The instrumentation amplifier of claim 4, wherein the gain of the third amplifying stage is approximately one and the gains of the first and second amplifying stages and the at least one additional amplifying stage are approximately equal to each other.

6. The instrumentation amplifier of claim 1, wherein the first chopper amplifier and the second chopper amplifier each comprises at least one chopper circuit.

7. The instrumentation amplifier of claim 1, further comprising a buffer circuit configured to provide a bias voltage coupled to the second amplifying stage and the third amplifying stage.

8. An apparatus comprising:
a first input and a second input;
a first chopper circuit coupled to the first and second inputs and providing a first chopped input and a second chopped input;
a main amplifier comprising a first main input coupled to the first chopped input, a second main input coupled to the second chopped input, a first and second main intermediate nodes, a main amplifier output, and a second chopper circuit coupled between the output and the first and the second main intermediate nodes, wherein a voltage at the first main intermediate node is substantially equal to a voltage at the second main intermediate node;
a sub amplifier coupled to the first main intermediate node and the second main intermediate node, the sub amplifier comprising first and second sub intermediate nodes and a third chopper circuit coupled to the first and second sub intermediate nodes, wherein a voltage at the first sub intermediate node is substantially equal to a voltage at the second sub intermediate node, and wherein an output of the third chopper circuit is coupled to the main amplifier; and
an output stage coupled to the main amplifier output and configured to provide an output voltage.

9. The apparatus of claim 8, wherein the first chopper circuit, the second chopper circuit, and the third chopper circuit each comprises a chopper switch.

10. The apparatus of claim 8, wherein the first, the second, and the third chopper circuits are configured to switch a pair of input signals between a pair of output terminals.

11. The apparatus of claim 10, wherein the first, the second, and the third chopper circuits each switches at a frequency determined by a clock signal coupled to the chopper circuits.

12. The apparatus of claim 8, wherein the first chopper circuit is configured to modulate the signal and wherein the second and third copper circuits are configured to demodulate the signal.

13. The apparatus of claim 8, wherein the sub-amplifier is configured to keep the voltage on the first main intermediate node substantially equal to the voltage on the second main intermediate node.

14. A method, comprising:
modulating the signal with a first chopper circuit;
amplifying the modulated signal;
demodulating the signal with a second chopper circuit;
filtering the demodulated signal with a low pass filter;
synchronizing the first chopper circuit and the second chopper circuit to a clock signal; and
synchronizing the low pass filter to a second clock signal based on the clock signal, wherein the second clock signal has a delayed activation compared to the clock signal.

15. The method of claim 14, wherein after filtering the demodulated signal the method further comprises amplifying the filtered signal.

16. The method of claim 14, wherein the modulating the signal comprises canceling an offset of the signal.

* * * * *